(12) United States Patent  
Hongo et al.

(10) Patent No.: US 11,984,240 B2  
(45) Date of Patent: May 14, 2024

(54) SHIELDED WIRE AND WIRE HARNESS

(71) Applicant: Yazaki Corporation, Tokyo (JP)

(72) Inventors: Satoko Hongo, Susono (JP); Hiroki Kondo, Susono (JP)

(73) Assignee: Yazaki Corporation, Tokyo (JP)

( * ) Notice: Subject to any disclaimer, the term of this patent is extended or adjusted under 35 U.S.C. 154(b) by 437 days.

(21) Appl. No.: 17/480,849

(22) Filed: Sep. 21, 2021

(65) Prior Publication Data

US 2022/0102022 A1  Mar. 31, 2022

(30) Foreign Application Priority Data

Sep. 25, 2020 (JP) ................................ 2020-160488

(51) Int. Cl.
| | |
|---|---|
| *H01B 7/04* | (2006.01) |
| *H01B 7/00* | (2006.01) |
| *H01B 7/18* | (2006.01) |
| *H01B 7/29* | (2006.01) |
| *H05K 9/00* | (2006.01) |

(52) U.S. Cl.
CPC ............. *H01B 7/0045* (2013.01); *H01B 7/18* (2013.01); *H01B 7/292* (2013.01); *H05K 9/0098* (2013.01)

(58) Field of Classification Search
CPC ...... H01B 7/02; H01B 7/0216; H01B 7/0241; H01B 7/04; H01B 7/0045; H01B 7/06; H01B 7/08; H01B 7/18; H01B 7/292; H01B 7/30; H01B 7/34; H01B 13/14; H01B 13/22; H05K 9/0098

USPC ........ 174/102 R, 103, 105, 106 R, 108, 109, 174/110 R

See application file for complete search history.

(56) References Cited

U.S. PATENT DOCUMENTS

| | | | |
|---|---|---|---|
| 4,568,401 A | 2/1986 | Davis | |
| 4,970,352 A * | 11/1990 | Satoh | H01B 11/1808 174/102 C |
| 9,349,505 B2 * | 5/2016 | Tozawa | H01B 3/446 |
| 2007/0105437 A1 * | 5/2007 | Imamura | H01B 11/1878 439/578 |
| 2009/0126993 A1 * | 5/2009 | Nishimura | H02G 1/14 156/48 |
| 2011/0036613 A1 * | 2/2011 | Hayashishita | H01B 3/445 174/105 R |
| 2012/0217035 A1 * | 8/2012 | Iwasaki | H01B 3/441 174/102 C |
| 2014/0367141 A1 | 12/2014 | Tozawa et al. | |

(Continued)

FOREIGN PATENT DOCUMENTS

| | | |
|---|---|---|
| DE | 3332905 A1 | 9/1984 |
| JP | 2014-139932 A | 7/2014 |
| JP | 2018-041606 A | 3/2018 |

*Primary Examiner* — William H. Mayo, III

(74) *Attorney, Agent, or Firm* — Banner & Witcoff, Ltd.

(57) ABSTRACT

A shielded electric wire includes an electric wire including a conductor portion and a cover portion covering the conductor portion, a shielded braid formed of a conductive linear material, the shielded braid covering an outer periphery of the cover portion and a sheath formed of an insulating resin, the sheath being provided around the shielded braid. The electric wire and the shielded braid together form an electric wire assembly. A flexible value of the sheath is equal to or smaller than a flexible value of the electric wire assembly, the flexible value being a value of a load required for bending an object for a predetermined extent.

3 Claims, 7 Drawing Sheets

(56) References Cited

U.S. PATENT DOCUMENTS

2015/0083458 A1* 3/2015 Tanaka ................... H01B 7/04
                                                        174/107
2016/0307669 A1* 10/2016 Tozawa ................... H01B 7/04
2018/0068763 A1*  3/2018 Ohgushi ............ H01B 11/1869

* cited by examiner

FIG. 6

CABLE EVALUATION RESULT

| | | EXAMPLE | COMPARATIVE EXAMPLE |
|---|---|---|---|
| SHEATH | MATERIAL | FOAMED EPDM | SOLID EPDM |
| | SPECIFICATION | CORRESPONDING TO SPONGE RUBBER E4288 MANUFACTURED BY INOAC CORPORATION | NORMAL TEMPERATURE SHRINKABLE TUBE PST8407-16 MANUFACTURED BY 3M |
| | BENDING LOAD (N) *BENDING RADIUS = 30 | 0.5 | 10.2 |
| ELECTRIC WIRE | SPECIFICATION | ·CONDUCTOR MATERIAL: PURE COPPER ·INSULATOR MATERIAL: POLYETHYLENE ·WIRE DIAMETER: 0.1 MM ·CONDUCTOR: 12sp × 3 TWISTED WIRES | |
| SHIELDED ELECTRIC WIRE | BENDING LOAD (N) *BENDING RADIUS = 30 | 8.3 | 19.4 |
| | OCCUPANCY RATE (%) | 41 | 50 |
| THE NUMBER OF TIMES OF BENDING (TEN THOUSAND TIMES) | | 750 OR MORE | 460 |

FIG. 7

| OCCUPANCY RATE (%) | 41 | 15 |
|---|---|---|
| CROSS-SECTIONAL IMAGE | | |
| APPLIED CURRENT (A) | 65 | 65 |
| CONDUCTOR SATURATION TEMPERATURE (°C) | 80.9 | 101.6 |

SHIELDED WIRE AND WIRE HARNESS

CROSS-REFERENCE TO RELATED APPLICATION

The present application claims priority to Japanese Patent Application No. 2020-160488 filed on Sep. 25, 2020, the entire content of which is incorporated herein by reference.

TECHNICAL FIELD

The present invention relates to a shielded electric wire and a wire harness.

BACKGROUND

A related art shielded electric wire includes an electric wire, a shielded braid, and a sheath. In the shielded electric wire, an inner diameter of the sheath in a natural state is determined based on such things as the inner diameter of the sheath and a thickness of the sheath in a state in which the sheath is provided at an outer periphery of the shielded braid, an elastic modulus of the sheath, a coefficient of static friction between the shielded braid and the electric wire, a coefficient of static friction between the shielded braid and the sheath, and a value of a load when a resistance value of the shielded braid is increased by 10% from an initial value after the load is repeatedly applied to the shielded braid for 5,000,000 times in an axial direction of the shielded braid (see JP2018-41606A, for example).

The shielded electric wire in the related art improves flexibility by optimizing the inner diameter of the sheath in a natural state, but does not consider flexibility of the sheath itself.

SUMMARY

Illustrative aspects of the present invention provide a shielded electric wire and a wire harness that can improve flexibility.

According to an illustrative aspect of the present invention, a shielded electric wire includes an electric wire including a conductor portion and a cover portion covering the conductor portion, a shielded braid formed of a conductive linear material, the shielded braid covering an outer periphery of the cover portion and a sheath formed of an insulating resin, the sheath being provided around the shielded braid. The electric wire and the shielded braid together form an electric wire assembly. A flexible value of the sheath is equal to or smaller than a flexible value of the electric wire assembly, the flexible value being a value of a load required for bending an object for a predetermined extent.

According to another illustrative aspect of the present invention, a wire harness includes the shielded electric wire.

Other aspects and advantages of the invention will be apparent from the following description, the drawings and the claims.

BRIEF DESCRIPTION OF DRAWINGS

FIG. 6 is a table showing the example and the comparative example; and

FIG. 7 is a table showing an occupancy rate and a conductor saturation temperature.

DESCRIPTION OF EMBODIMENTS

Figure 1:
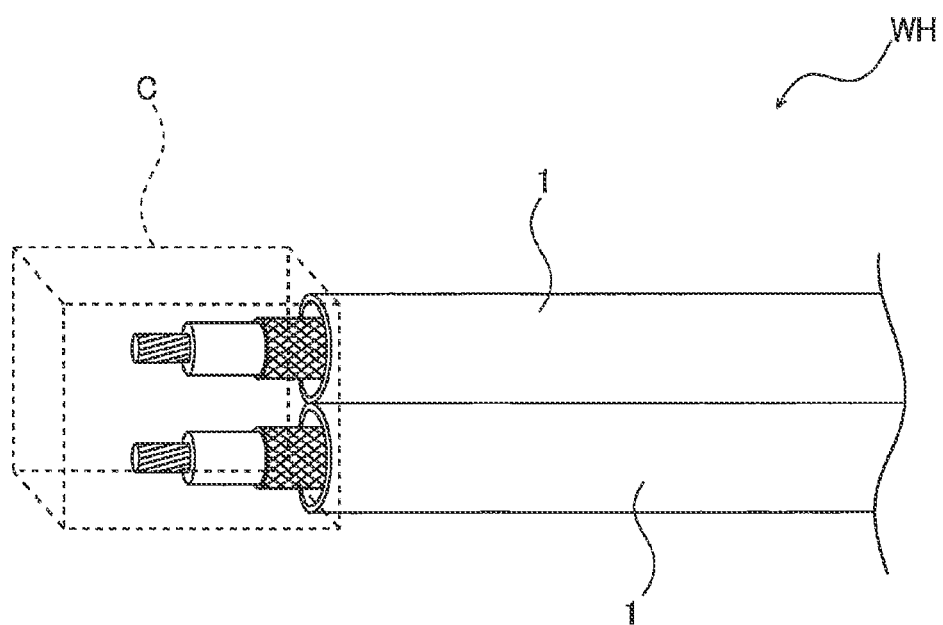
FIG. 1 is a configuration diagram showing an example of a wire harness including a shielded electric wire according to an embodiment of the present invention.

FIG. 1 is a configuration diagram showing an example of a wire harness including a shielded electric wire according to an embodiment of the present invention. As shown in FIG. 1, a wire harness WH includes a plurality of shielded electric wires 1 to be described in detail below.

In the example shown in FIG. 1, the wire harness WH includes a connector C in addition to the plurality of shielded electric wires 1. The connector C has a terminal accommodating chamber (not shown), and a terminal crimped or the like to the shielded electric wire 1 is to be accommodated in the terminal accommodating chamber. The wire harness WH may further include an exterior member such as a corrugated tube (not shown), and may include a tape winding portion. The exterior member such as a corrugated tube is provided at an outer peripheral side of the shielded electric wire 1 for the purpose of, for example, protecting the shielded electric wire 1. The tape winding portion is a portion where an adhesive tape is to be wound around the shielded electric wires 1 for the purpose of preventing the shielded electric wires 1 from scattering or the like. The wire harness WH may include one shielded electric wire 1 and another electric wire, or may include three or more shielded electric wires 1. Further, the wire harness WH may not include the connector C.

Figure 2:
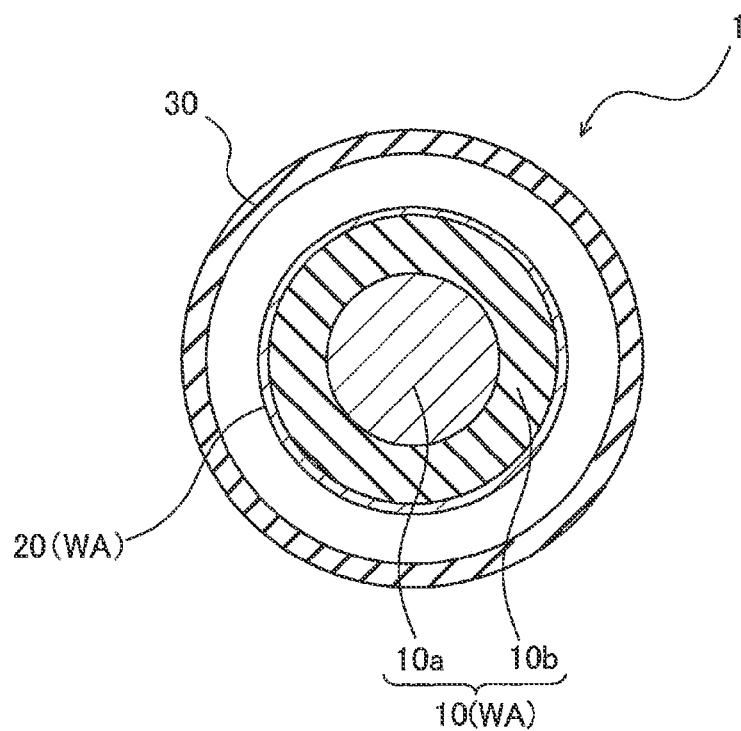
FIG. 2 is a cross-sectional view showing details of the shielded electric wire shown in FIG. 1.

FIG. 2 is a cross-sectional view showing details of the shielded electric wire 1 shown in FIG. 1. As shown in FIG. 2, the shielded electric wire 1 includes an electric wire 10, a shielded braid 20, and a sheath 30. The electric wire 10 includes a conductor portion 10a and a cover portion 10b. In the present embodiment, the conductor portion 10a is formed of twisted wires in which a plurality of metal strands made of copper, aluminum, an alloy of copper and aluminum, or the like are twisted.

Each of the plurality of metal strands has a diameter of, for example, 0.05 mm or more and 0.12 mm or less. Here, since the diameter of the metal strand is 0.05 mm or more, the strand is not excessively thin and is less likely to be broken due to repeated bending. Also, since the diameter of the metal strand is 0.12 mm or less, flexibility of the strand can be secured (distortion due to bending can be reduced), and the strand is less likely to be broken due to repeated bending.

The shielded braid 20 is formed by braiding 48 plated fiber bundles (an example of a conductive linear material) that are obtained by metal plating high-strength fibers, and covers an outer periphery of the electric wire 10. Here, the high-strength fiber is a fiber material that is chemically synthesized from a raw material such as petroleum, and has a tensile strength at breakage of 1 GPa or more and an elongation rate at breakage of 1% or more and 10% or less. Examples of such high-strength fibers include aramid fibers, polyarylate fibers, and PBO fibers. The metal plating is formed of a metal such as copper or tin.

For example, the high-strength fiber is a polyarylate fiber (φ 0.022 mm, the number of filaments is 300), and the metal plating is laminated on each fiber in the order of copper and tin from a lower layer (center) and has a thickness of 2.4 μm.

The sheath 30 is a tubular member made of an insulating resin and is provided around an outer periphery of the shielded braid 20. The sheath 30 is made of, for example, foamed ethylene propylene diene rubber (EPDM). In the present embodiment, the sheath 30 is provided at the outer periphery of the shielded braid 20 with a gap between the sheath 30 and the shielded braid 20 (that is, the sheath 30 is not in contact with the shielded braid 20).

Here, in the present embodiment, a flexible value of the sheath 30 is set to be equal to or less than a flexible value of an electric wire assembly WA including the electric wire 10 and the shielded braid 20. Here, the flexible value indicates a load required for bending an object for a predetermined extent.

Figure 3:
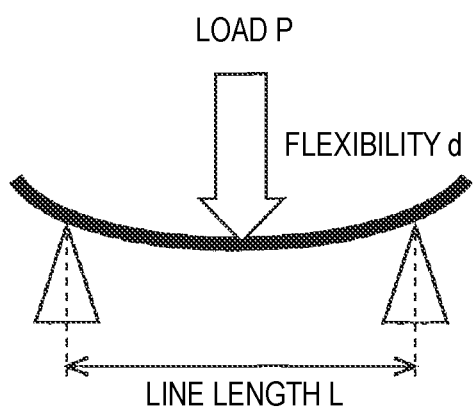
FIG. 3 is a side view for explaining a flexible value of an object.

FIG. 3 is a side view for explaining a flexible value of an object. First, when a load is applied to an object as shown in FIG. 3, a relational expression of $d=PL^3/48EI$ is satisfied, in which d is the value of flexibility, P is the value of load, L is a line length, E is a Young's modulus, and I is a second moment of area.

Based on this expression, the load P is $P=48EId/L^3$. Here, when the load required to bend the sheath 30 and the electric wire assembly WA by the same amount (bending for a predetermined extent, or predetermined bending) is measured with lengths of lines of the sheath 30 and the electric wire assembly WA being the same, components of the flexibility d and the line length L can be removed, and the value (flexible value) of the load P required for the predetermined bending depends on the magnitude of EI.

That is, in the present embodiment, the EI of the sheath 30 is equal to or less than the EI of the electric wire assembly WA, so that a flexible value of the sheath 30 is equal to or less than a flexible value of the electric wire assembly WA. Therefore, a member having the same flexibility as the electric wire assembly WA or a member softer than the electric wire assembly WA is used as the sheath 30 in the present embodiment. Therefore, it is possible to prevent a situation in which the overall flexibility of the shielded electric wire 1 is defined by the hardness of the sheath 30 with the sheath 30 being harder than the electric wire assembly WA, and it is possible to enhance the overall flexibility.

In addition, in the present embodiment, an occupancy rate under a normal environmental temperature (25° C.) is set equal to or less than 45%, in which the occupancy rate is obtained by dividing a sum of a cross-sectional area of the electric wire 10 and a cross-sectional area of the shielded braid 20 by a circular area within the sheath 30, i.e., an area of a circle whose diameter being an inner diameter of the sheath 30. Therefore, for example, even when the sheath 30 contracts at a high temperature or the like, it is possible to prevent the sheath 30 from contacting and sticking to the electric wire assembly WA. Accordingly, it is possible to prevent a situation in which the electric wire assembly WA and the sheath 30 are integrated with each other, thereby increasing distortion at the time of bending, and it is possible to improve flexibility.

Furthermore, in the present embodiment, the occupancy rate is set equal to or greater than 15% (preferably 20% or more, and more preferably 30% or more) under a normal environmental temperature (25° C.). Therefore, it is possible to prevent a decrease in thermal conductivity caused by an increase in the amount of air layers due to an excessively low occupancy rate, and it is possible to contribute to preventing the temperature of the conductor portion 10a from becoming excessively high.

Figure 4:
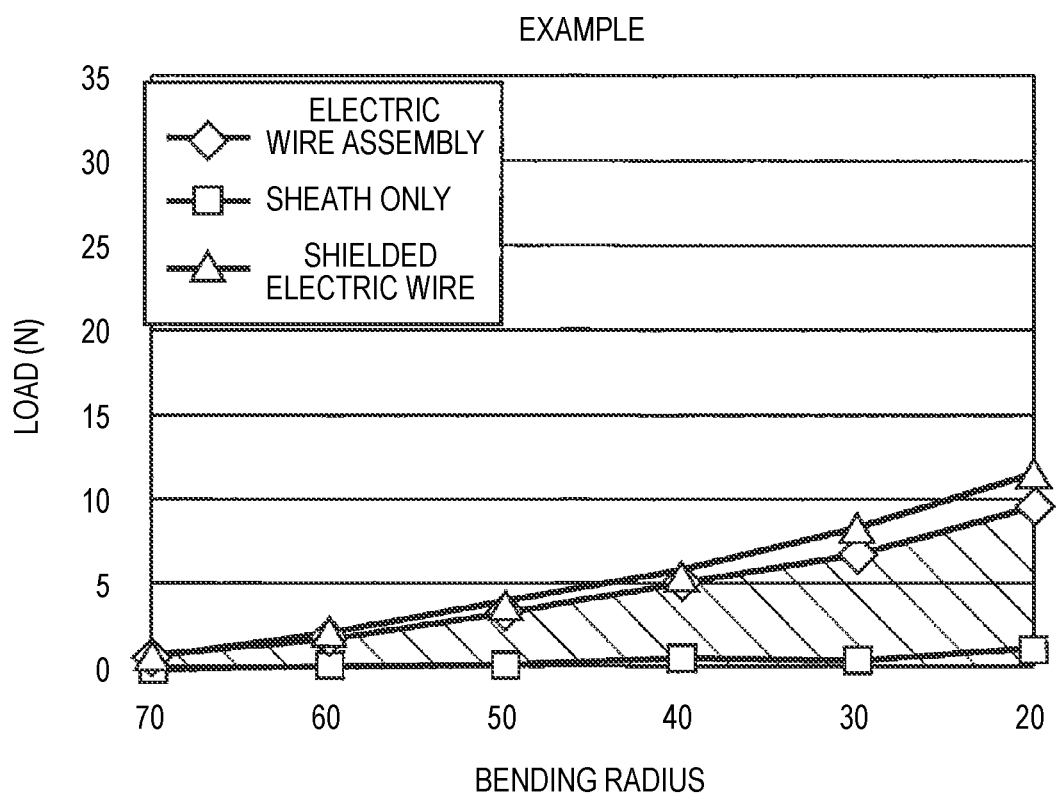
FIG. 4 is a graph showing flexibility of a shielded electric wire according to an example.
Figure 5:
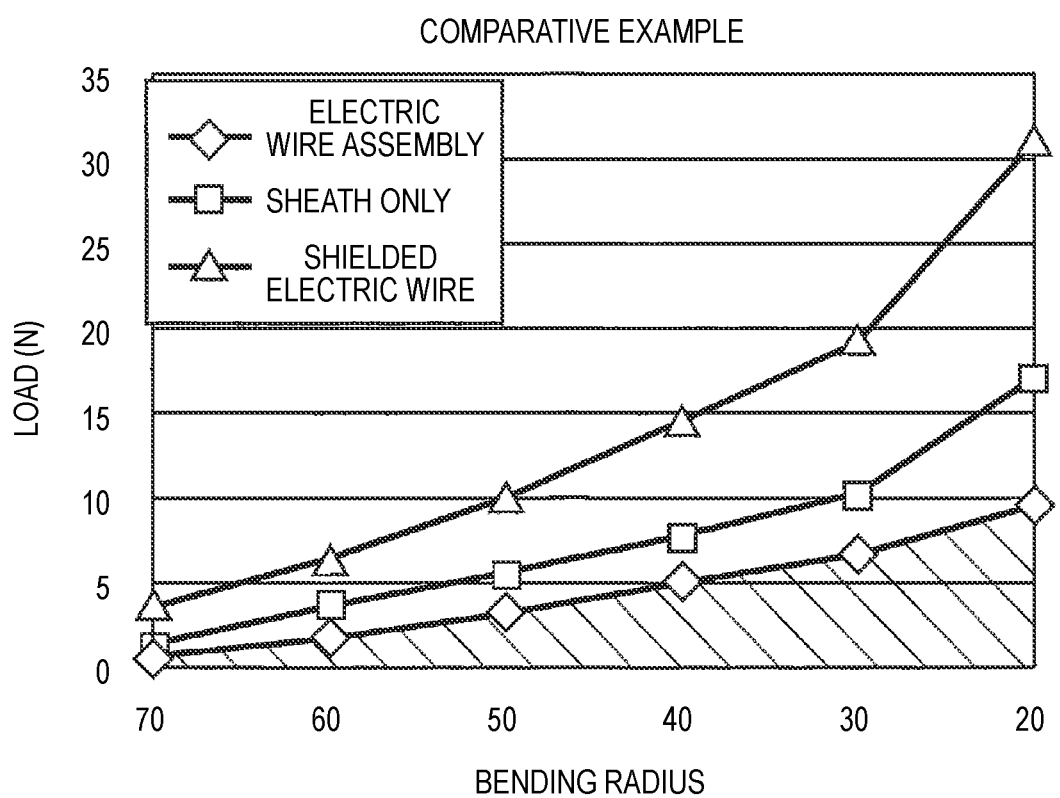
FIG. 5 is a graph showing flexibility of a shielded electric wire according to a comparative example.

Next, an example of the present embodiment and a comparative example will be described. FIG. 4 is a graph showing flexibility of a shielded electric wire according to the example. FIG. 5 is a graph showing flexibility of a shielded electric wire according to a comparative example. FIG. 6 is a table showing the example and the comparative example.

Electric wire assemblies of the shielded electric wires according to the example and the comparative example are the same. As shown in FIG. 6, an electric wire assembly is used in a manner in which three 12 sq electric wires were twisted together and a highly flexible braid was disposed around an outer periphery of the twisted electric wires. A conductor portion was made of pure copper having a wire diameter of 0.1 mm, and a cover portion was made of polyethylene. A sheath according to the example used a foamed EPDM (corresponding to sponge rubber E4288 manufactured by Inoac Corporation). An occupancy rate in the example was set to 41%. On the other hand, a sheath according to the comparative example used an unfoamed solid EPDM (a normal temperature shrinkable tube PST8407-16 manufactured by 3M). An occupancy rate in the comparative example was set to 50%.

In the shielded electric wire according to the example, a flexible value of the sheath is located in a hatched region in FIG. 4, and the flexible value of the sheath is equal to or less than a flexible value of an electric wire assembly. Therefore, as shown in FIGS. 4 and 6, in the shielded electric wire according to the example, a bending load when R (bending radius R) is 30 was 0.5 N for the sheath, and 8.3 N for the entire shielded electric wire.

On the other hand, in the shielded electric wire according to the comparative example, a flexible value of the sheath is not located in a hatched region in FIG. 5, and the flexible value of the sheath exceeds a flexible value of an electric wire assembly. Therefore, as shown in FIGS. 5 and 6, in the shielded electric wire according to the comparative example, a bending load when R is 30 was 10.2 N for the sheath, and 19.4 N for the entire shielded electric wire.

As described above, it was found that the shielded electric wire according to the example had higher flexibility than the shielded electric wire according to the comparative example.

As a result of performing a flexibility test on the shielded electric wire according to the example, the number of times of bending was 7,500,000 times or more, and it was found that high flexibility performance of 5,000,000 times or more can be achieved. On the other hand, the number of times of bending of the shielded electric wire according to the comparative example was only 4,600,000 times. In the flexibility test, a mandrel to make a bending of R being 30 was used, and one end side of a shielded electric wire having a predetermined length was not loaded, and the other end side was loaded and repeatedly bent at 90° along the mandrel at a bending speed of 80 rpm. The number of times of reciprocating bending until a resistance value of a conductor portion was increased by 10% was measured as a result of the repeated bending. The measurement was performed three times, and an average value was calculated.

Here, when the sheath contracts at a high temperature or the like, the sheath may stick to the electric wire assembly, and in a case where the sheath sticks to the electric wire assembly, the electric wire assembly and the sheath are integrated with each other at the time of bending, and distortion of the conductor portion is increased, which causes a decrease in flexibility. However, since the shielded electric wire according to the example has the occupancy rate of 45% or less, it was found that the sheath can be prevented from sticking to the electric wire assembly even when the sheath contracts at a high temperature or the like, and the flexibility can be improved. On the other hand, the shielded electric wire according to the comparative example had an occupancy rate of more than 45%, and the sheath stuck to the electric wire assembly at the time of bending, so that distortion was increased, which causes a decrease in flexibility. Therefore, it was found that the shielded electric wire according to the example had higher flexibility than the shielded electric wire according to the comparative example.

Although description of such example is omitted, it was confirmed that the sheath was not limited to the foamed EPDM, and may be a rubber material such as silicone rubber, fluororubber, and chloroprene rubber, or a thermoplastic elastomer such as TPU (polyurethane-based thermoplastic elastomer).

FIG. 7 is a table showing an occupancy rate and a conductor saturation temperature. In respective views at right of cross-sectional images of FIG. 7, temperature is indicated by hatching density. As shown in FIG. 7, the shielded electric wire according to the example has an occupancy rate of 41%. Here, when an applied current was 65 A, a conductor saturation temperature in the environment in which the measurement was carried out was 80.9° C. On the other hand, in a case where the occupancy rate of the shielded electric wire according to the example was changed to 15%, the conductor saturation temperature in the measurement environment was 101.6° C. when the applied current was 65 A.

Therefore, it was also found that the occupancy rate was preferably high from the viewpoint of conductor temperature. In particular, as shown in FIG. 7, when the occupancy rate is 15% or more, the conductor saturation temperature can be 101.6° C. or less. Therefore, it was found that the conductor saturation temperature can be set to equal to or less than a heat resistant safe temperature of many types of rubber materials (a temperature that is lower than a heat resistant limit temperature and the rubber materials are safe even in a long time exposure).

In this manner, according to the shielded electric wire 1 and the wire harness WH according to the present embodiment, since the flexible value of the sheath 30 indicating a load required for predetermined bending is equal to or less than the flexible value of the electric wire assembly WA including the electric wire 10 and the shielded braid 20, the sheath 30 uses a member having the same flexibility as the electric wire assembly WA or a softer member than the electric wire assembly WA. Therefore, it is possible to prevent a situation in which the overall flexibility of the shielded electric wire 1 is defined by the hardness of the sheath 30 with the sheath 30 being harder than the electric wire assembly WA, and it is possible to enhance the overall flexibility.

Since the occupancy rate obtained by dividing a sum of a cross-sectional area of the electric wire and a cross-sectional area of the shielded braid by a circular area within the sheath 30, i.e., an area of a circle whose diameter being an inner diameter of the sheath 30, is set to 45% or less, the sheath 30 can be prevented from sticking to the electric wire assembly WA even when, for example, the sheath 30 contracts at a high temperature or the like. Accordingly, it is possible to prevent a situation in which the electric wire assembly WA and the sheath 30 are integrated with each other and distortion is increased at the time of bending, and it is possible to improve flexibility.

Since the occupancy rate is set to 15% or more, it is possible to prevent a decrease in thermal conductivity caused by an increase in the amount of air layers due to an excessively low occupancy rate, and it is possible to contribute to preventing the temperature of the conductor portion 10a from becoming excessively high.

While the present invention has been described with reference to certain exemplary embodiments thereof, the scope of the present invention is not limited to the exemplary embodiments described above, and it will be understood by those skilled in the art that various changes and modifications may be made therein without departing from the scope of the present invention as defined by the appended claims.

For example, materials and the like described in the above embodiments can be changed as appropriate. In addition, the shielded braid 20 is not limited to a braided one, and may be a bundle of linear materials simply extending in a longitudinal direction of the shielded electric wire 1. In addition, when a plurality of electric wires 10 are provided in the sheath 30, the plurality of electric wires 10 may not be twisted with each other.

Further, although there is a gap between the electric wire assembly WA and the sheath 30 in the present embodiment, the present invention is not limited thereto, and, for example, the electric wire assembly WA and the sheath 30 may be in close contact with each other for the purpose of flexibility only.

What is claimed is:

1. A shielded electric wire comprising:
an electric wire including a conductor portion and a cover portion covering the conductor portion;
a shielded braid formed of a conductive linear material, the shielded braid covering an outer periphery of the cover portion; and
a sheath formed of an insulating resin, the sheath being provided around the shielded braid,
wherein the electric wire and the shielded braid together form an electric wire assembly,
wherein a flexible value of the sheath is equal to or smaller than a flexible value of the electric wire assembly, the flexible value being a value of a load required for bending an object for a predetermined extent, and
wherein, when an environmental temperature is 25° C., an occupancy rate is equal to or less than 45% and equal to or greater than 15%, the occupancy rate being a value obtained by dividing a sum of a cross-sectional area of the electric wire and a cross-sectional area of the shielded braid by an area of a circle whose diameter being an inner diameter of the sheath.

2. The shielded electric wire according to claim 1, wherein the occupancy rate is equal to or greater than 30%.

3. A wire harness comprising:
the shielded electric wire according to claim 1.

* * * * *